United States Patent
Choi et al.

(10) Patent No.: US 6,483,364 B2
(45) Date of Patent: Nov. 19, 2002

(54) LADDER TYPE CLOCK NETWORK FOR REDUCING SKEW OF CLOCK SIGNALS

(75) Inventors: Young-don Choi, Seoul (KR); Chang-sik Yoo, Suwon (KR); Kee-wook Jung, Seoul (KR); Won-chan Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/864,190

(22) Filed: May 25, 2001

(65) Prior Publication Data

US 2002/0033724 A1 Mar. 21, 2002

(30) Foreign Application Priority Data

Sep. 20, 2000 (KR) ........................................ 2000-55204

(51) Int. Cl.[7] ................................................. G06F 1/04
(52) U.S. Cl. ........................ 327/295; 327/269; 327/283; 327/297; 365/233
(58) Field of Search ........................... 327/261, 269–271, 327/291, 293, 295, 297, 382, 564, 565, 165, 290; 375/356, 293, 362; 326/101, 47; 365/233; 713/500, 501, 600

(56) References Cited

U.S. PATENT DOCUMENTS

| | | | | |
|---|---|---|---|---|
| 5,521,599 A | * | 5/1996 | McCarroll et al. | 341/122 |
| 5,572,719 A | * | 11/1996 | Biesterfeldt | 327/176 |
| 5,654,659 A | * | 8/1997 | Asada | 327/161 |

FOREIGN PATENT DOCUMENTS

KR 2000-0040542 7/2000

* cited by examiner

*Primary Examiner*—Timothy P. Callahan
*Assistant Examiner*—Minh Nguyen
(74) *Attorney, Agent, or Firm*—Volentine Francos, PLLC

(57) ABSTRACT

A ladder type clock network for reducing the skew of clock signals is provided. The clock network includes a buffer for buffering a clock signal, first delay units for delaying the output of the first buffer by a set time, second buffers connected to respective outputs of the first delay units, and second delay units connected to respective outputs of the second buffers. The first delay units and the second delay units consist essentially of the resistance and capacitance of lines through which the clock signal propagates. Accordingly, the skew of the internal clock signals is reduced, and internal clock signals having a stable duty with respect to variations in a semiconductor device manufacturing process, temperature, and power supply voltage, are generated.

16 Claims, 3 Drawing Sheets

20, 2000, the
LADDER TYPE CLOCK NETWORK FOR REDUCING SKEW OF CLOCK SIGNALS

This application relies for priority upon Korean Patent Application No. 2000-55204, filed on Sep. 20, 2000, the contents of which are herein incorporated by reference in their entirety.

BACKGROUND OF THE INVENTION

The present invention relates to a semiconductor integrated circuit, and more particularly to a clock network for reducing the skew of clock signals.

In semiconductor integrated circuits, an external clock signal input to one pin is converted into a plurality of internal clock signals that propagate along different paths throughout the entire device. The internal clock signals are ideal when they have the same slew rates and duties, and have no skew. However, internal clock signals that are distant from a clock input pin can be delayed more than internal clock signals next to the clock input pin. This is an important issue in high speed operation of semiconductor integrated circuits, and so a phase blending method has been developed to solve the problem.

FIG. 1 illustrates a conventional clock network in which a phase blending method is implemented. As shown in FIG. 1, the clock network 100 is a U-shaped clock network that receives an input clock signal CLK and generates a plurality of internal clock signals $ICLK_i$ (where i is a number between 1 and 9). The input clock signal CLK is connected to a plurality of serially-connected first delay devices 110a through 110f through a buffer 101, and the outputs of the delay devices 110a through 110e are connected to phase blenders 140a through 140e, respectively. The last delay device 110f is in turn connected to a plurality of serially-connected second delay devices 130a through 130f.

The first delay devices 110a through 110f and the second delay devices 130a through 130f are manifested as the impedance of a line, e.g., a metal line.

Outputs of the first delay devices 110a through 110e and the second delay devices 130a through 130e are input to respective phase blenders 140a through 140e. Outputs of the phase blenders 140a through 140e provide the internal clock signals $ICLK_i$.

The first internal clock signal $ICLK_1$ is determined by the phase blender 140a as an intermediate waveform between a signal of a first up node $UP_1$, i.e., the signal output from the first delay device 110a, and a signal of the first down node $DN_1$, i.e., the signal output from the second delay device 130a. In operation, the signal of a first down node $DN_1$ has passed the first up node $UP_1$, the first delay devices 110b through 110f, and the second delay devices 130a through 130e.

The second through ninth internal clock signals $ICLK_i$ (where i is a number between 2 and 9) are generated in a similar manner.

The phase blenders 140a through 140e are disclosed in B.W. Garlepp, "Portable Digital DLL for High Speed Interface", IEEE, Journal of Solid State Circuits, May 1999. The phase blender of this article is stable in a state in which two received clock signals slope slightly. However, when the clock signals have a greater slope, jitter is generated in the clock signals.

In addition, since loads of the first delay devices 110a through 110f and the second delay devices 130a through 130f are different, a delay of the clock signals input to the phase blenders 140a through 140e is nonlinear. Furthermore, since the phase blenders 140a through 140e operate nonlinearly, a delay of the clock signals is even more nonlinear. As a result, the internal clock signals $ICLK_i$ are inevitably skewed. Since the blended rate in the phase blenders 140a through 140e changes with the variation in the power supply voltage, the temperature, and the semiconductor device manufacturing process, the range of a skew value is similarly wide.

Thus, a clock network which is capable of reducing the skew of the internal clock signals $ICLK_i$ is required.

SUMMARY OF THE INVENTION

To solve the above problems, it is an object of the present invention to provide a clock network for reducing the skew of clock signals.

Accordingly, to achieve the above object, a clock network is provide that comprises a plurality of first delay units connected in a line, each operating to delay a clock signal by a first time; a plurality of buffers connected to respective outputs of the first delay units, the buffers operating to generate internal clock signals; and a plurality of second delay units connected in a line, each second delay unit being connected to an output of a respective one of the plurality of buffers.

In addition, a clock network could also be provided that comprises a buffer for buffering a clock signal; a plurality of first delay units formed in a line for delaying an output of the first buffer by a first time; and a plurality of second delay units connected to respective outputs of the first delay units.

In this clock network, respective outputs of first and second buffers are preferably connected via a plurality of buffers.

A clock network may also be provided that comprises a first buffer for buffering a clock signal; a plurality of first delay units for delaying an output of the first buffer by a first time; a plurality of second buffers connected to respective outputs of the first delay units; and a plurality of second delay units connected to respective outputs of the second buffers.

In each of these clock networks the first and second delay units preferably consist essentially of the resistance and capacitance of lines through which the clock signal propagates. In addition, the first delay units and the second delay units preferably have bilateral output characteristics.

According to the present invention, the skew of the internal clock signals is reduced, and internal clock signals are generated that have a stable duty with respect to a variation in a semiconductor device manufacturing process, temperature, and power supply voltage.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
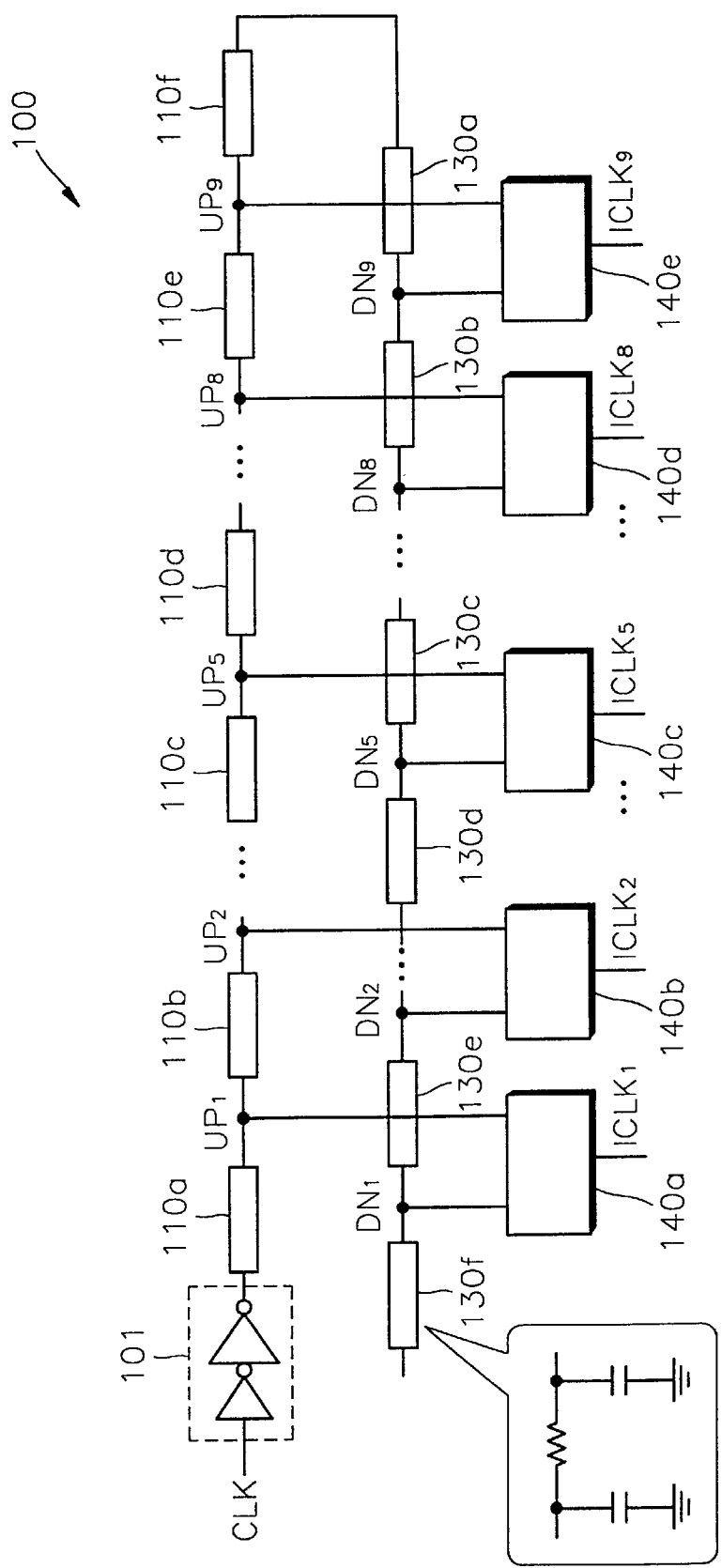
FIG. 1 illustrates a conventional clock network in which a phase blending method is implemented.

The present invention will be described more fully below with reference to the accompanying drawings in which a preferred embodiment of the person invention is shown. Throughout the drawings, like reference numerals refer to like elements.

Figure 2:
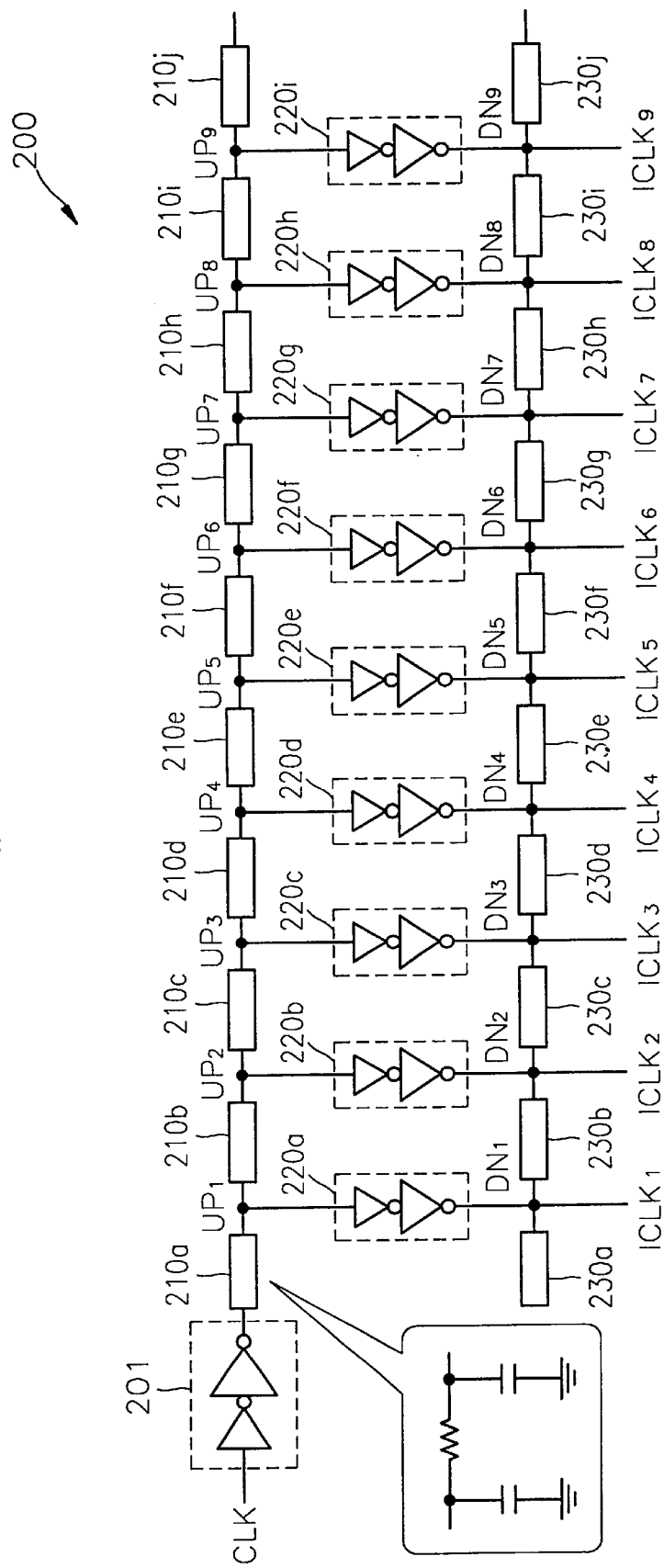
FIG. 2 illustrates a ladder type clock network according to a preferred embodiment of the present invention.

FIG. 2 illustrates a ladder type clock network according to a preferred embodiment of the present invention. Referring to FIG. 2, a clock network 200 receives a clock signal CLK and generates internal clock signals $ICLK_i$ (where i is a number between 1 and 9). The clock network 200 includes a first buffer 201, a plurality of first delay units 210a through 210j, a plurality of second buffers 220a through 220i, and a plurality of second delay units 230a through 230j.

The first buffer 201 receives the clock signal CLK and transmits the clock signal CLK to the first delay unit 210a. The first delay units 210a through 210i denote a kind of line load, e.g., a metal line having a certain sheet resistance value, and the first delay units 210a through 210j represent the resistance and capacitance of a metal line having a predetermined length. Output nodes $UP_1$ through $UP_9$ of the first delay units 210a through 210j are connected to the second buffers 220a through 220i, respectively.

The second delay units 230a through 230j are connected to output nodes $DN_1$ through $DN_9$ of the second buffers 220a through 220i. The second delay units 230a through 230j are preferably much the same as the first delay units 210a through 210j and preferably have bilateral output characteristics. Each of the output nodes $DN_1$ through $DN_9$ of the second buffers 220a through 220i provides a respective internal clock signal $ICLK_i$.

The clock network 200 is referred to as a ladder type clock network, and its operation will be described with reference to FIG. 3, which illustrates the flow of the first internal clock signal $ICLK_1$.

There are nine signal paths provided to the first internal clock signal $ICLK_1$. The first path is from the output node $UP_1$, to the buffer 220a; the second path is from the output node $UP_1$ though the delay unit 210b, the buffer 220b, and the delay unit 230b; the third path is from the output node $UP_1$ to the delay units 210b and 210c, the buffer 220c, and the delay units 230c and 230b; the fourth path is from the output node $UP_1$, through the delay units 210b, 210c, and 210d, the buffer 220d, and the delay units 230d, 230c and 230b; the fifth path is from the output node $UP_1$ through the delay units 210b, 210c, 210d, and 210e, the buffer 220e, and the delay units 230e, 230d, 230c and 230b; the sixth path is from the output node $UP_1$ through the delay units 210b, 210c, 210d, 210e, and 210f, the buffer 220f, and the delay units 230f, 230e, 230d, 230c and 230b; the seventh path is from the output node $UP_1$ through the delay units 210b, 210c, 210d, . . . , and 210g, the buffer 220g, and the delay units 230g, 230f, 230e, . . . , and 230b; the eighth path is from the output node $UP_1$ through the delay units 210b, 210c, 210d, . . . , and 210h, the buffer 220h, and the delay units 230h, 230g, 230f, . . . , and 230b; and the ninth path is from the output node $UP_1$ through the delay units 210b, 210c, 210d, . . . , and 210i, the buffer 220i, and the delay units 230i, 230h, 230g, . . . , 230b. Thus, the first internal clock signal $CLK_1$ is generated in the output node $DN_1$ by blending clock signals transmitted through these nine paths.

Figure 3:
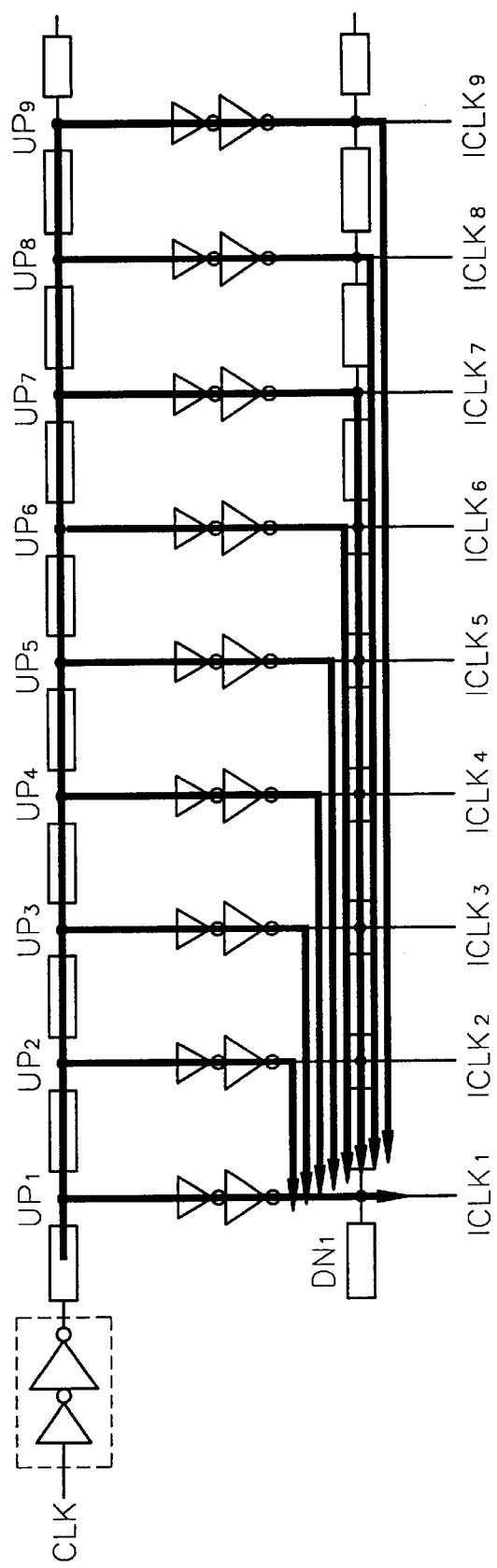
FIG. 3 illustrates the flow of a first internal clock signal of FIG. 2.

Meanwhile, the ninth internal clock signal $ICLK_9$ is also provided by nine paths (although not shown in FIG. 3). These paths include a first path from the output node $UP_1$ through the delay units 210b, 210c, . . . , and 210i and the buffer 220i; a second path from the output node $UP_1$ through the delay units 210b, 210c, . . . , and 210h, the buffer 220h, and the delay unit 230i; a third path from the output node $UP_1$ through the delay units 210b, 210c, . . . , and 210g, the buffer 220g, and the delay units 230h and 230i; a fourth path from the output node $UP_1$ through the delay units 210b, 210c, . . . , and 210f, the buffer 220f, and the delay units 230g, 230h and 230i; a fifth path from the output node $UP_1$ through the delay units 210b, 210c, 210d, and 210e, the buffer 220e, and the delay units 230f, 230g, 230h and 230i; a sixth path from the output node $UP_1$ through the delay units 210b, 210c, and 210d, the buffer 220d, and the delay units 230e, 230f, 230g, 230h and 230i; a seventh path from the output node $UP_1$ through the delay units 210b and 210c, the buffer 220c, and the delay units 230d, 230e, . . . , and 230i; an eighth path from the output node $UP_1$ through the delay units 210b, the buffer 220b, and the delay units 230c, 230d, . . . , and 230i, and a ninth path from the output node $UP_1$ through the buffer 220a, and the delay units 230b, 230c, . . . , and 230i. Thus, the ninth internal clock signal $ICLK_9$ is generated in the output node $DN_9$ also by blending clock signals transmitted through nine different paths.

Besides the first internal clock signal $ICLK_1$ and the ninth internal clock signal $ICLK_9$, the other internal clock signals $ICLK_2$ through $ICLK_8$ are also generated by blending the clock signals transmitted through nine different paths. Thus, the internal clock signal $ICLK_1$ of the conventional clock network shown in FIG. 1 is jittered by an output waveform due to a distance between two blended phases, and jitter increases, but in the present invention, closely arranged phases are blended together, thereby solving the problem of the conventional art.

In this way, paths through which the internal clock signals $ICLK_1$ through $ICLK_9$ are generated are very similar, on average. Thus, there is no skew of the generated internal clock signals $ICLK_1$ through $ICLK_9$.

Since variations in parameters such as a semiconductor device manufacturing process, temperature, and a power supply voltage are averaged by paths through which the internal clock signals $ICLK_1$ through $ICLK_9$ propagate, change in duty and skew of the internal clock signals $ICLK_1$ through $ICLK_9$ is reduced.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A clock network comprising:
   a plurality of first delay units connected in a line, each operating to delay a clock signal by a first time;
   a plurality of buffers connected to respective outputs of the first delay units, the buffers operating to generate internal clock signals; and
   a plurality of second delay units connected in a line, each second delay unit being connected to an output of a respective one of the plurality of buffers.

2. The clock network as recited in claim 1, wherein the first delay units and the second delay units consist essentially of the resistance and capacitance of lines through which the clock signal propagates.

3. The clock network as recited in claim 1, wherein the first delay units and the second delay units have bilateral output characteristics.

4. A clock network comprising:
   a first buffer for buffering a clock signal;
   a plurality of first delay units formed in a line, each for delaying an output of the first buffer by a corresponding time; and a plurality of second delay units connected to respective outputs of the first delay units by a plurality of second buffers, wherein the plurality of second delay units have bilateral output characteristics.

5. The clock network as recited in claim 4, wherein the first delay units and the second delay units consist essentially of the resistance and capacitance of lines through which the clock signal propagates.

6. The clock network as recited in claim 4, wherein the first delay units have bilateral output characteristics.

7. A clock network comprising:

a first buffer for buffering a clock signal;

a plurality of first delay units, each for delaying an output of the first buffer by a corresponding time;

a plurality of second buffers connected to respective outputs of the first delay units; and a plurality of second delay units connected to respective outputs of the second buffers, wherein the plurality of second delay units have bilateral output characteristics.

8. The clock network as recited in claim 7, wherein the first delay units and the second delay units consist essentially of the resistance and capacitance of lines through which the clock signal propagates.

9. The clock network as recited in claim 7, wherein the first delay units have bilateral output characteristics.

10. A clock network, comprising:

a plurality of first delays connected in series, a first one of the first delays in the series adapted to receive a buffered clock signal and each of the first delays being adapted to delay the buffered clock signal by a corresponding delay time;

a plurality of buffers each having an input connected to an output of one of the first delays; and a plurality of second delays connected in series, each of the second delays having a first end connected to an output of one of the plurality of buffers and having a second end connected to an output of another of the plurality of buffers.

11. The clock network of claim 10, wherein the second delays are bilateral.

12. The clock network of claim 11, wherein the second delay consists essentially of resistance and capacitance of lines through which the clock signal propagates.

13. The clock network of claim 10, wherein each of the first delays are adapted to delay the clock signal by a same delay time.

14. The clock network of claim 10, wherein each of the second delays are adapted to delay the clock signal by a corresponding delay time.

15. The clock network of claim 14, wherein each of the second delays are adapted to delay the clock signal by a same delay time.

16. The clock network of claim 10, wherein the first delays are bilateral.

* * * * *